United States Patent
Lu et al.

(10) Patent No.: US 9,595,987 B2
(45) Date of Patent: Mar. 14, 2017

(54) WIDE TUNING RANGE RECEIVER

(71) Applicant: PC-TEL, Inc., Bloomingdale, IL (US)

(72) Inventors: Wei Lu, Bethesda, MD (US); John Kyechong Kim, Annandale, VA (US)

(73) Assignee: PC-TEL, INC., Bloomingdale, IL (US)

( * ) Notice: Subject to any disclaimer, the term of this patent is extended or adjusted under 35 U.S.C. 154(b) by 0 days.

(21) Appl. No.: 14/300,451

(22) Filed: Jun. 10, 2014

(65) Prior Publication Data

US 2014/0370831 A1 Dec. 18, 2014

Related U.S. Application Data

(60) Provisional application No. 61/834,233, filed on Jun. 12, 2013.

(51) Int. Cl.
*H04B 1/10* (2006.01)
*H03D 7/14* (2006.01)
*H03D 7/16* (2006.01)

(52) U.S. Cl.
CPC ......... *H04B 1/1036* (2013.01); *H03D 7/1483* (2013.01); *H03D 7/161* (2013.01); *H04B 2001/1072* (2013.01)

(58) Field of Classification Search
CPC ...... H04B 1/30; H04B 1/7107; H04B 17/102; H04B 17/18; H04B 17/20; H04B 17/21; H04B 17/309; H04B 17/318; H04B 1/1027; H04B 1/109; H04B 1/707; H04B 7/0408; H04B 7/0822
USPC ....................................................... 455/295
See application file for complete search history.

(56) References Cited

U.S. PATENT DOCUMENTS

| 4,340,974 | A | | 7/1982 | Cooke et al. | |
|---|---|---|---|---|---|
| 5,068,918 | A | * | 11/1991 | Verheijen | H03D 5/00 348/731 |
| 5,390,346 | A | * | 2/1995 | Marz | H04N 5/50 348/735 |
| 5,956,098 | A | * | 9/1999 | Mizukami | H04N 5/4401 348/555 |
| 5,963,856 | A | | 10/1999 | Kim | |
| 6,006,078 | A | * | 12/1999 | Yamamoto | H03J 5/0272 331/11 |

(Continued)

FOREIGN PATENT DOCUMENTS

WO    WO 2013/075261 A1    5/2013

OTHER PUBLICATIONS

Wikipedia's definition of Direct-conversion receiver—http://en.wikipedia.org/wiki/Direct_conversion_receiver (Jun. 12, 2013).

(Continued)

*Primary Examiner* — Ajibola Akinyemi
(74) *Attorney, Agent, or Firm* — Husch Blackwell LLP

(57) ABSTRACT

A wide tuning range receiver is provided that includes first and second mixers, and first and second local oscillators. The first mixer can mix an input signal with a signal from the first local oscillator and output a signal having a first intermediate frequency, the second mixer can mix the signal having the first intermediate frequency with a signal from the second local oscillator and output a signal having a second intermediate frequency, and, for each input signal frequency, a relationship between the first and second local oscillators can be fixed.

24 Claims, 1 Drawing Sheet

(56) References Cited

U.S. PATENT DOCUMENTS

| | | | |
|---|---|---|---|
| 6,823,181 B1 * | 11/2004 | Kohno | H03D 1/2245 |
| | | | 455/323 |
| 7,035,614 B2 | 4/2006 | Dessert et al. | |
| 7,599,673 B2 | 10/2009 | Maxim et al. | |
| 7,778,613 B2 | 8/2010 | Seendripu et al. | |
| 7,894,790 B2 | 2/2011 | Gomez et al. | |
| 8,224,279 B2 | 7/2012 | Dickey et al. | |
| 8,259,876 B2 | 9/2012 | Shi et al. | |
| 2003/0132455 A1 * | 7/2003 | Utsunomiya | H03D 7/161 |
| | | | 257/200 |
| 2004/0116096 A1 | 6/2004 | Shen | |
| 2008/0181340 A1 | 7/2008 | Maxim | |
| 2009/0238312 A1 | 9/2009 | Shi et al. | |

OTHER PUBLICATIONS

Wikipedia's definition of Superheterodyne receiver—http://en.wikipedia.org/wiki/Superheterodyne_receiver (Jun. 12, 2013).

Lloyd Butler VK5BR—Radio receivers have developed considerably over the years around a principle first evolved in 1918. Following Is a discussion on the principle of the superheterodyne and factors which affect its design; Introduction to the Superheterodyne Receiver (Delivered as a talk to the Adelaide Hills Amateur Radio Society in Aug. 1988. Published later in the journal "Amateur Radio", Mar. 1989) http://users.tpg.com.au/users/ldbutler/Superhet.htm (Jun. 12, 2013).

Extended European search report and search opinion for corresponding patent application EP 14171943.5, dated Oct. 31, 2014.

Examination report from corresponding EP patent application EP14171943.5, dated Aug. 10, 2016.

* cited by examiner

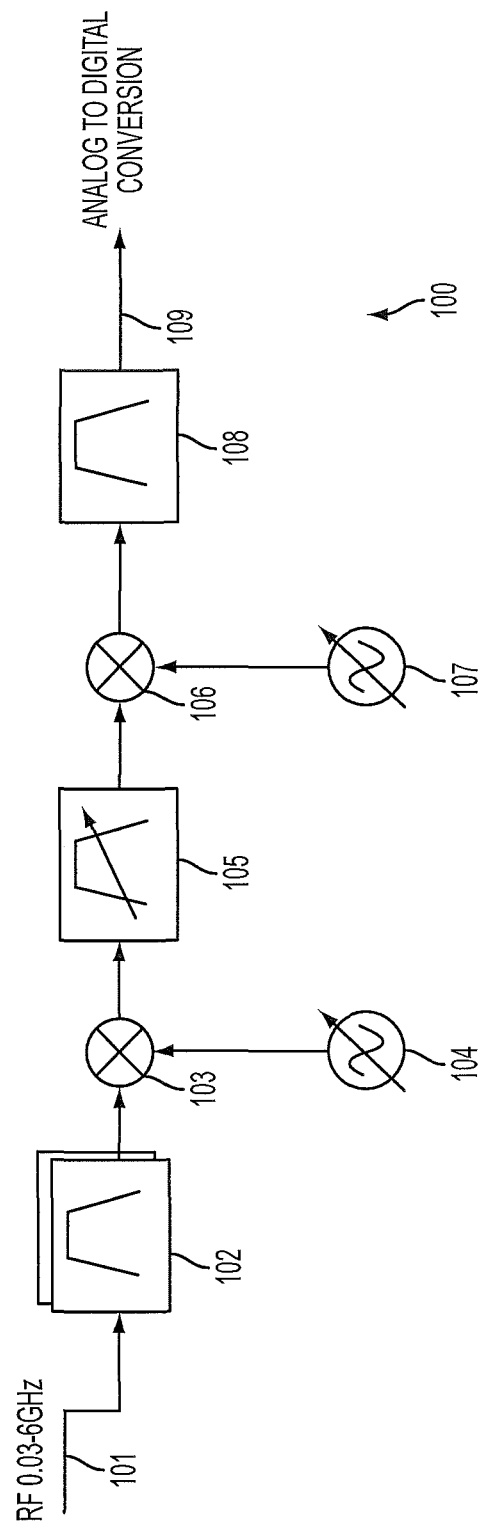

WIDE TUNING RANGE RECEIVER

CROSS-REFERENCE TO RELATED APPLICATIONS

This application claims priority to U.S. Provisional Patent Application No. 61/834,233 filed Jun. 12, 2013 and titled "Wide Tuning Range Receiver". U.S. Application No. 61/834,233 is hereby incorporated by reference.

FIELD

The present invention relates generally to receivers. More particularly, the present invention relates to a wide tuning range receiver.

BACKGROUND

Within the wireless test and measurement industry, radio architectures utilizing fixed band filters and technology specific software have traditionally been adequate in supporting the wireless industry. However, the recent acceleration by operators to migrate from 2G/3G to 4G-LTE has created a need for single unit, multi-band, multi-technology scanners. Additionally, new markets, such as military, government, and local municipalities, outside of the traditional commercial wireless arena, are adopting synergistic wireless solutions to commercial carriers but utilize separate and often ad-hoc or dynamic spectrum assignments.

The need for operators and network optimization vendors to have at-will capability to access and deploy all frequencies across many global markets has proven to be challenging, both with funding and the logistics of equipment distribution. Indeed, accomplishing RF frequency agility by traditional means has, to date, proven to be cost and performance prohibitive.

Known receivers used in the industry include a homodyne receiver (zero intermediate frequency (IF)) and a superheterodyne receiver (with IF). The following discussion addresses some of the advantages and disadvantages of these types of known receivers.

Known homodyne receivers include a simple architecture and no high level or direct image issues caused by a local oscillator (LO). However, known homodyne receivers have inherent poor performance of I/Q imbalance, LO leakage, and spurious free dynamic range due to the high requirement of the even order of frequency mixing components. For example, I/Q phase and gain imbalance in known homodyne receivers can cause a different type of image, and known homodyne receivers have terrible LO suppression, poor intermodulation rejection, and are limited in dynamic range. As a result, the use of a homodyne receiver structure does not provide the required dynamic range and does not yield the required performance for an instrument grade receiver.

Known superheterodyne receivers have a good general performance. For example, these structures, when combined with a digital IF, have no I/Q imbalance issue and less of a LO leakage problem. However, in a wide tuning range, image rejection and intermodulation rejection are problematic and spurious signals from mixed components are difficult to control. For example, superheterodyne structures, combined with a digital IF, inherently result in more frequency mixing issues, such as internally generated spurs and mixed byproducts. Considering that such superheterodyne receivers cover several octaves of frequencies, such signal/LO mixing poses a huge threat in the performance of the receiver by inclusion of the unwanted byproducts. Additionally, wide band superheterodyne receivers are often very difficult and costly to manufacture in order to reject the inherent image response and suppress intermodulation non-linearities across wide range front-end filter frequencies.

A large challenge related to the design of a superheterodyne structure comes from its fixed IF. With a fixed IF, the IF filters can be custom-made with surface acoustic wave (SAW) or ceramic technologies. These filters have superior performance in terms of sharp roll-off within the transition band just a few MHz outside of the pass band and thus, are able to reject any incoming unwanted signals from the front-end.

However, fixed IF structures are susceptible to the intermodulation byproducts generated from the overall system that fall within the IF frequency itself. During the design stage, careful overall system frequency planning is required to ensure intermodulation performance. However, this planning often results in unreasonable RF isolation requirements between areas of the overall system and can lead to bulky and costly implementations. The increasing signal bandwidth required by many markets also adds to the difficulty of filter design and IF selection.

In order to reject the image and intermodulation across a wide frequency range, one existing approach for a wide band tuning system utilizing superheterodyne architecture is to use a tunable pre-selector, front-end filter. This approach places a band pass filter that is able to adjust its center to the interested frequency in the very front of the receiver before the first mixer, and the filter is designed to suppress the potential signals that will generate the in-band intermodulation components after the mixer. At a minimum, the frequencies causing image and half-IF responses must be aligned within the tunable filter's stop band across the whole tuning range. However, this filter approach faces a great challenge in design in order to result in good system characteristics over a few octaves of tuning range and accuracy across the expected temperature range. Furthermore, the front-end filter cannot expand the frequency range on an as-needed basis. Indeed, a fixed IF is required when the filter has a sharp roll-off, making the superheterodyne architecture difficult to modify, difficult to integrate, and difficult to migrate.

Another existing approach utilizing a superheterodyne architecture is a more common wide band approach that uses fixed band filtering in the RF front. Instead of using a tunable pre-selector filter, a group of fixed filters are used and switched into the signal path to cover the span of the desired wide band. However, a lot of fixed filters are required, and, because of increasing signal bandwidth and for better intermodulation performance in the IF, each filter requires a custom design leading to bulky and costly high order filters. Furthermore, once a design is finished, the same architecture is not able to expand to different ranges of frequencies.

When considering integration on a single chip, known superheterodyne structures also have inherent limitations in size, integration, and isolation requirements due to the size of the IF filter and the difficulty in designing a wide range tunable filter that covers the whole range of interest. Accordingly, most IC receivers must be designed as a homodyne structure with limited performance.

In view of the above, there is a need for an improved wide tuning range receiver.

BRIEF DESCRIPTION OF THE DRAWINGS

FIG. 1 is a block diagram of a wide tuning range receiver in accordance with disclosed embodiments.

DETAILED DESCRIPTION

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein include a device that solves the above-identified problems with known receiver architectures, including the wide range and wide tuning band problems of known architectures. In some embodiments, the architecture of the device disclosed herein can be easy to design and manufacture and can be shrunk to a small size by chip integration.

For example, embodiments disclosed herein include a wireless, wide tuning range receiver. Some embodiments disclosed herein include a scanner with frequency agile radio architecture and the capability of post-sales customization of RF frequencies and technologies and/or post-sales software upgrades by a user or other customer for frequency selection and technologies that can allow for manufacturing and customer distribution flexibility and support the dynamic needs of modern operators and supporting customers.

In some embodiments, the wide tuning range receiver disclosed herein can receive a wide band signal. For example, in exemplary embodiments, the receiver disclosed herein can tune from approximately 30 MHz to approximately 6 GHz. In some embodiments, the receiver disclosed herein can provide for programmable tuning and set up for each receiver in production to allow for compensation in part and/or production variations.

In some embodiments, the receiver disclosed herein can include a programmable IF filter with block conversion that can allow for superior suppression of a LO and its harmonics. In some embodiments, the receiver disclosed herein can have superior image and intermodulation rejection, can have superior dynamic range and linearity, and can be easy to manufacture and/or expand. Furthermore, in some embodiments, the receiver disclosed herein can include functional elements that are easy to design and can be integrated on a single chip, for example, a single dedicated ASIC subsystem or chip.

To support optimal business results by addressing the fast expansion of RF bands for commercial cellular and/or wireless use while minimizing the cost of a highly integrated tuning system, some embodiments disclosed herein can include a software defined radio with the capability of tuning to anywhere in a frequency spectrum. For example, in some embodiments, an RF receiver in accordance with disclosed embodiments can be capable of tuning across a wide range and can be employed in classical applications, such as spectrum analysis.

In some embodiments, a RF receiver as disclosed herein can be tuned from several MHz to a few GHz while preserving high suppression of internally generated intermodulation and spurs across the whole tuning range within a wide signal bandwidth, for example, when the actual receiving signal bandwidth is approximately 20 MHz or wider. In some embodiments, a receiver in accordance with disclosed embodiments can be employed in a wide range of applications because the receiver's design and architecture can be compact and integrated into a small form factor with minimum manufacturing tuning and with substantially no field tuning when enabling a band within the manufactured tuning range.

In some embodiments, a receiver's radio system response to the following unwanted signals can be a factor when designing the receiver: images, half IF, and higher order intermodulation, such as n*signal±m*LO, where n and m are integers greater than 1. In some embodiments, a receiver as disclosed herein can provide an approach to solve known wide range and wide tuning problems by employing architecture that is easy to design and manufacture and that can be shrunk to a small size by chip integration.

FIG. 1 is a block diagram of a wide tuning range receiver 100 in accordance with disclosed embodiments. However, it is to be understood that the architecture shown in FIG. 1 is exemplary only and that embodiments disclosed herein can include additional and/or alternative receiver architectures as well.

Although not shown in FIG. 1, it is also to be understood that the receiver 100 can include and/or can be controlled by control circuitry, one or more programmable processors, and/or executable control software stored on a transitory or non-transitory computer readable medium, including, but not limited to, local computer memory, RAM, optical storage media, magnetic storage media, flash memory, and the like. In some embodiments, the control circuitry, the programmable processors, and/or the executable control software can control, for example, via a control signal, local oscillators, mixers, and/or filters in the receiver 100.

As seen in FIG. 1, the receiver 100 can receive as input an RF signal 101 having a frequency of approximately 0.03 GHz to approximately 6 GHz. Then, the input signal 101 can be passed into a bank of fixed filters 102. In some embodiments, control circuitry, programmable processors, and/or executable control software can control the bank of fixed filters 102, including the pass and stop bands of the filters 102.

In some embodiments, at least one of the fixed filters 102 can include a switched inductor, capacitor-type filter. In some embodiments, the bank of fixed filters 102 can include a pass band that is narrower than a tunable range of the receiver 100, and in some embodiments, a width of the filters' 102 pass band can be smaller than half of a first IF of the receiver 100.

Although only one fixed filter 102 is shown in FIG. 1, it is to be understood that the receiver 100 can include a plurality of fixed filters 102. The fixed filters 102 can reject the image of a mixer 103, and, depending on the availability of a LO 104 frequency range, the receiver 100 can include multiple filters, each covering a range, in lieu of the fixed filters 102.

The signal output from the bank of fixed filters 102 can pass to the mixer 103, which can mix the signal output from the bank of fixed filters 102 with a signal from the LO 104. In some embodiments, control circuitry, programmable processors, and/or executable control software can control the mixer 103 and/or the LO 104. The output of the mixer 103 can be a signal having a first IF.

In some embodiments, the LO 104 can be placed as far away as possible from the band of interest. The LO 104 can be tunable for a wide range, and because the LO 104 can be spaced far away from the band of interest with high injection, some embodiments disclosed herein do not require filters with sharp roll-offs. Accordingly, simple filter designs can be easily integrated.

As seen in FIG. 1, the mixed signal having the first IF that is output from the mixer 103 can pass through a tunable filter 105. The tunable filter 105 can have a wide tunable range, but can be several times narrower than the input frequency range. In some embodiments, control circuitry, programmable processors, and/or executable control software can control the tunable filter 105, including the center frequency to which the filter 105 is tuned.

The filtered signal output from the tunable filter 105 can pass to the mixer 106, which can mix the signal output from the tunable filter 105 with a signal from an LO 107. In some embodiments, control circuitry, programmable processors, and/or executable control software can control the mixer 106 and/or the LO 107. The output of the mixer 106 can be a signal having a second IF.

In some embodiments, the targeted performance of the tunable filter 105 can be determined by the second IF and its bandwidth. In some embodiments, the second IF can be fixed and can be approximately 500 MHz. For example, if the selected second IF is approximately 475-500 MHz with a second IF bandwidth of approximately 20 MHz, then the LO 107 can be tuned at approximately 475-500 MHz above the input of the mixer 106. Accordingly, the tunable filter 105 can pass a 20 MHz wide signal while rejecting the image at approximately 950-1000 MHz away and the half IF at approximately 227.5-250 MHz away. In some embodiments, a switched inductor, capacitor-type filter can meet these requirements. For example, in some embodiments, the capacitor can be tunable. This is advantageous because such architecture facilitates the tunable receiver 100 being integrated into an integrated circuit by eliminating the need for bulky surface acoustic or ceramic types of filters.

The signal output from the mixer 106 can be filtered by a fixed IF filter 108 for anti-aliasing. Then, the signal can be sampled by an analog-to-digital converter (ADC) 109 and routed to digital subsystems for further processing. In some embodiments, further RF down mixing can be employed before the signal is sampled by the ADC 109.

In some embodiments, for each input target frequency of the receiver 100, the relationship between the first and second local oscillators 104, 107 is the only system constraint that needs to be fixed. Accordingly, there are an infinite number of possibilities of the frequencies for the local oscillators 104, 107. For example, as explained below, some embodiments disclosed herein include four choices of a fixed relationship between the first and second local oscillators 104, 107.

In some embodiments disclosed herein, both of the local oscillators can use a high side injection scheme, and in these embodiments, the equation of tuning the receiver 100 can be as shown in Equation 1:

$$f_{in} = f_{LO104} - f_{LO107} + f_{ADC} \quad (1)$$

where fADC can include the input of the ADC 109 and, in some embodiments, can be approximately 470-500 MHz.

In view of the above, to receive fin, the local oscillators 104, 107 can be set in such a way that their difference is fADC lower than fin. It is to be understood that there are an unlimited number of configurations for fLO 104 and fLO 107 as long as, as is the case in some embodiments disclosed herein, the difference between the two is fixed. Accordingly, in practice, a good IF can be chosen to minimize spurious impact.

In some embodiments disclosed herein, the LO 104 can use a high side injection scheme and the LO 107 can use a low side injection scheme, and in these embodiments, the equation of tuning the receiver 100 can be as shown in Equation 2:

$$f_{in} = f_{LO104} - f_{LO107} - f_{ADC} \quad (2)$$

In some embodiments disclosed herein, the LO 104 can use a low side injection scheme and the LO 107 can use a high side injection scheme, and in these embodiments, the equation of tuning can be as shown in Equation 3:

$$f_{in} = f_{LO104} + f_{LO107} - f_{ADC} \quad (3)$$

In some embodiments disclosed herein, both of the local oscillators 104, 107 can use a low side injection scheme, and in these embodiments, the equation of tuning can be as shown in Equation 4:

$$f_{in} = f_{LO104} + f_{LO107} + f_{ADC} \quad (4)$$

In view of the above, a tunable filter system as disclosed herein that utilizes down conversion to an IF need not cover the entire input wide band of the receiver 100. For example, for an approximately 30 MHz to approximately 6 GHz design, a tunable filter design covering approximately 0.6-0.7 GHz to approximately 2.7 GHz can be sufficient to allow for use of known and readily available local oscillators and integrated front-end filters. That is, in some embodiments, the first IF can be approximately 0.6-0.7 GHz to approximately 2.7 GHz. In some embodiments, the reduction of the required range for the tunable filter can greatly reduce the difficulty and complexity of the design and ease production.

With the dual, wide range tunable local oscillators and the tunable filter used for IF selectivity of the receiver 100 shown in FIG. 1, the receiver 100 can provide superior performance in terms of providing options to avoid locally generated intermodulation and harmonics.

Known material and manufacturing techniques typically include an IF below approximately 3 GHz. Furthermore, a superheterodyne architecture can include the inherent drawback of feed-through signals resulting in ghost signal components in the digital domain when the input frequency is near the IF frequency. However, with the dual, wide range tunable local oscillators and tunable IF filter architecture of the receiver 100 shown in FIG. 1, a user can change the IF to another frequency, as needed, so that feed-through signals will not impact the signal observed downstream.

Some embodiments disclosed herein can provide extreme flexibility in handling on-board spurious impact and intermodulation. For example, in some embodiments, at least one of the fixed filters 102 can include a pass band from approximately 2.6 GHz to approximately 3.9 GHz, the LO 104 can tune from approximately 4 GHz to approximately 6 GHz, and the LO 107 can tune from approximately 1.2 GHz to approximately 1.9 GHz. In some embodiments, the oscillators 104, 107 can be fundamental.

When a receiver 100 as shown in FIG. 1 is implemented, a tuning lookup table can be employed for choosing different settings. For example, an exemplary lookup table is shown in Table 1.

TABLE 1

Exemplary Tuning Lookup Table

| Input 101 (GHz) | LO 104 (GHz) | Filter 105 (GHz) |
|---|---|---|
| 2.6 | 4 | 1.4 |
| 3.1 | 4 | 0.8 |
| 3.2 | 4.6 | 1.4 |
| 3.5 | 4.6 | 1.1 |
| 3.6 | 4.9 | 1.3 |
| 3.9 | 4.9 | 1 |

In some embodiments, the IF frequency and the LO 104 can change with the input.

Because the requirements of the local oscillators 104, 107 are flexible in embodiments disclosed herein, in production, the LO 104 and the LO 107 can be tuned to handle a particular RF board's characteristics. Accordingly, each production unit can employ a tuning lookup table to specifically tune and optimize the unit to its own characteristics.

By changing the IF for each unit and allowing for arbitrary IF over a wide range, some embodiments disclosed herein can avoid problems caused by variations in manufacturing and parts and can avoid most discrete on-board spurious impact as well as the mixture of on-board spurious impact with any signal. Some embodiments disclosed herein can also relax the filter design. For example, in the examples discussed above, the front-end filter need only stop a band below approximately 1.4 GHz and above approximately 4.6 GHz to avoid substantially all of the intermodulation signal components from mixing the input and the LO. This is advantageous because tunable filter ranges from approximately 1.0 GHz to approximately 1.4 GHz are easier to design.

The dual, wide band LO and tunable IF filter design disclosed herein can play a key role in the flexibility of embodiments disclosed herein. For example, as long as the input frequency is within the range of the LO 104, the LO 104 does not need to change for different applications. However, for an integrated system, when a new frequency band that was not covered previously is added, a filter in the bank of filters 102 can be added. In cellular applications, a filter 102 can also be moved outside of the receiver 100 and external filters can be used for different cellular bands.

From the foregoing, it will be observed that numerous variations and modifications may be effected without departing from the spirit and scope of the invention. It is to be understood that no limitation with respect to the specific system or method illustrated herein is intended or should be inferred. It is, of course, intended to cover by the appended claims all such modifications as fall within the spirit and scope of the claims.

What is claimed is:

1. An apparatus comprising:
   at least one band pass filter;
   first and second mixers; and
   first and second local oscillators,
   wherein the band pass filter processes an input signal and passes a filtered signal to the first mixer,
   wherein the first mixer mixes the filtered signal with a signal from the first local oscillator and outputs a signal having a first intermediate frequency,
   wherein the second mixer mixes the signal having the first intermediate frequency with a signal from the second local oscillator and outputs a signal having a second intermediate frequency,
   wherein, for each input signal frequency, a relationship between the first and second local oscillators is fixed,
   wherein the first local oscillator is tuned to a selected frequency based on a tuning lookup table that compensates for part and production characteristics and variations of the apparatus, and
   wherein a relationship between the input signal frequency and the selected frequency of the first local oscillator is non-fixed.

2. The apparatus as in claim 1 having a tuning range of 30 MHz to 6 GHz.

3. The apparatus as in claim 2 wherein the first intermediate frequency is 600 MHz to 2.7 GHz.

4. The apparatus as in claim 3 wherein the second intermediate frequency is 500 MHz, and wherein the second intermediate frequency is fixed.

5. The apparatus as in claim 1 wherein the band pass filter includes a fixed non-tunable filter.

6. The apparatus as in claim 1 wherein a pass band of the band pass filter is narrower than half of the first intermediate frequency.

7. The apparatus as in claim 5 further comprising control circuitry, a programmable processor, and/or executable control software stored on a non-transitory computer readable medium for controlling, via a control signal, the fixed non-tunable filter.

8. The apparatus as in claim 1 further comprising a tunable filter between the first mixer and the second mixer, wherein the tunable filter processes the signal having the first intermediate frequency and passes a filtered signal having the first intermediate frequency to the second mixer.

9. The apparatus as in claim 8 wherein a tunable range of the tunable filter is narrower than a tunable range of the apparatus.

10. The apparatus as in claim 8 wherein the second intermediate frequency and a bandwidth of the second intermediate frequency determine a targeted performance of the tunable filter.

11. The apparatus as in claim 8 wherein the tunable filter comprises an inductor, capacitor-type filter, and wherein a capacitor of the tunable filter is tunable.

12. The apparatus as in claim 8 further comprising control circuitry, a programmable processor, and/or executable control software stored on a non-transitory computer readable medium for controlling, via a control signal, the tunable filter.

13. The apparatus as in claim 1 further comprising a non-tunable filter, wherein the non-tunable filter processes the signal having the second intermediate frequency.

14. The apparatus as in claim 1 further comprising an analog-to-digital converter, wherein the analog-to-digital converter samples the signal having the second intermediate frequency.

15. The apparatus as in claim 1 wherein each of the first and second local oscillators employs a high side injection scheme or a low side injection scheme, and wherein a determination of whether to employ the high side injection scheme or the low side injection scheme is specific to the apparatus.

16. The apparatus as in claim 1 wherein the second local oscillator is tuned to a second selected frequency based on the tuning lookup table that compensates for part and production characteristics and variations of the apparatus.

17. The apparatus as in claim 1 wherein the first and second mixers and the first and second local oscillators are integrated onto a single chip.

18. The apparatus as in claim 1 further comprising control circuitry, a programmable processor, and/or executable control software stored on a non-transitory computer readable medium for controlling, via a control signal, the first and second mixers and the first and second oscillators.

19. The apparatus as in claim 1 wherein internally generated intermodulation, spurs, mixing products, and images are suppressed.

20. A method comprising:
    a band pass filter processing an input signal and passing a filtered signal;
    tuning a first local oscillator to a selected frequency based on a tuning lookup table that compensates for part and production characteristics and variations;

a first mixer mixing the filtered signal with a signal from the first local oscillator;

the first mixer outputting a signal having a first intermediate frequency;

a second mixer mixing the signal having the first intermediate frequency with a signal from a second local oscillator; and the second mixer outputting a signal having a second intermediate frequency, wherein, for each input signal frequency, a relationship between the first and second local oscillators is fixed, wherein a tuning range for the input signal is wide, wherein the first intermediate frequency is narrower than the tuning range for the input signal, wherein second intermediate frequency is fixed, and wherein a relationship between the input signal frequency and the selected frequency of the first local oscillator is non-fixed.

21. The apparatus as in claim 1 wherein the tuning lookup table is stored in digital media.

22. The method of claim 20 further comprising:
storing the tuning lookup table in digital media.

23. The apparatus as in claim 1 wherein the tuning lookup table identifies a plurality of frequencies for the first local oscillator without a restriction in a difference between each of the plurality of frequencies.

24. The apparatus as in claim 1 wherein the at least one band pass filter includes a plurality of fixed filters, and wherein one of the plurality of fixed filters is selected to process the input signal and pass the filtered signal to the first mixer based on a frequency range of the first local oscillator.

* * * * *